United States Patent [19]

Stokes

[11] 4,360,743
[45] Nov. 23, 1982

[54] SOLID STATE CONTROL DEVICE FOR GRADUALLY TURNING ON AND OFF AN ELECTRICAL LOAD

[76] Inventor: John H. Stokes, Box 513, Las Cruces, N. Mex. 88001

[21] Appl. No.: 171,479

[22] Filed: Jul. 23, 1980

[51] Int. Cl.³ .............................................. H03K 17/72
[52] U.S. Cl. .......................... 307/252 B; 307/252 W; 315/199
[58] Field of Search ............... 307/141, 252 B, 252 N, 307/252 W; 315/194, 199, 200 A, 291, 360; 323/320, 321

[56] References Cited

U.S. PATENT DOCUMENTS

| | | |
|---|---|---|
| 3,358,186 | 12/1967 | Nomura . |
| 3,739,198 | 6/1973 | Clements . |
| 3,764,832 | 10/1973 | Stettner . |
| 3,814,948 | 6/1974 | Schuchmann et al. . |
| 3,846,648 | 11/1974 | Scott . |
| 3,868,544 | 2/1975 | Banks . |
| 3,939,361 | 2/1976 | Aidala et al. . |
| 3,940,660 | 2/1976 | Edwards . |
| 3,990,033 | 11/1976 | Wall . |
| 3,991,343 | 11/1976 | Delpy . |
| 4,002,925 | 1/1977 | Monahan . |
| 4,008,416 | 2/1977 | Nakasone . |
| 4,082,961 | 4/1978 | Genuit . |
| 4,085,399 | 4/1978 | Wall . |
| 4,147,961 | 4/1979 | Elms . |
| 4,151,426 | 4/1979 | Price . |
| 4,151,515 | 4/1979 | Pease et al. . |
| 4,152,607 | 5/1979 | Nakasone ........................ 307/252 B |
| 4,152,608 | 5/1979 | Nakasone et al. . |

*Primary Examiner*—John Zazworsky
*Attorney, Agent, or Firm*—Schuyler, Banner, Birch, McKie & Beckett

[57] ABSTRACT

A solid state control device is disclosed for gradually controlling the turn on and turn off of a light bulb. The light bulb is connected to an AC power source through a full wave rectifier having a semiconductor switching circuit connected across it which short circuits the full wave rectifier when an SCR or triac in the semiconductor switching circuit is turned on. A capacitor is normally charged to turn off the SCR or triac when a mechanical on/off switch forming part of the semiconductor switching circuit is in the off position. Upon turning the switch to the on position, the capacitor is discharged to slowly turn on the triac or SCR to short circuit the full wave rectifier and actuate the light bulb. These same circuit components are used when the switch is turned to the timed off position to slowly turn the triac or SCR off which thereby slowly turns off the light bulb. Essentially, this semiconductor switching circuit is comprised of a resistor-capacitor network which is actuated by either a mechanical switch or by the gate current leakage of the triac or SCR itself. The gradual charging or discharging action of this circuit changes the firing or conduction angle of the triac or SCR to accomplish both gradual turn on and turn off of the light bulb to thereby increase bulb life.

10 Claims, 6 Drawing Figures

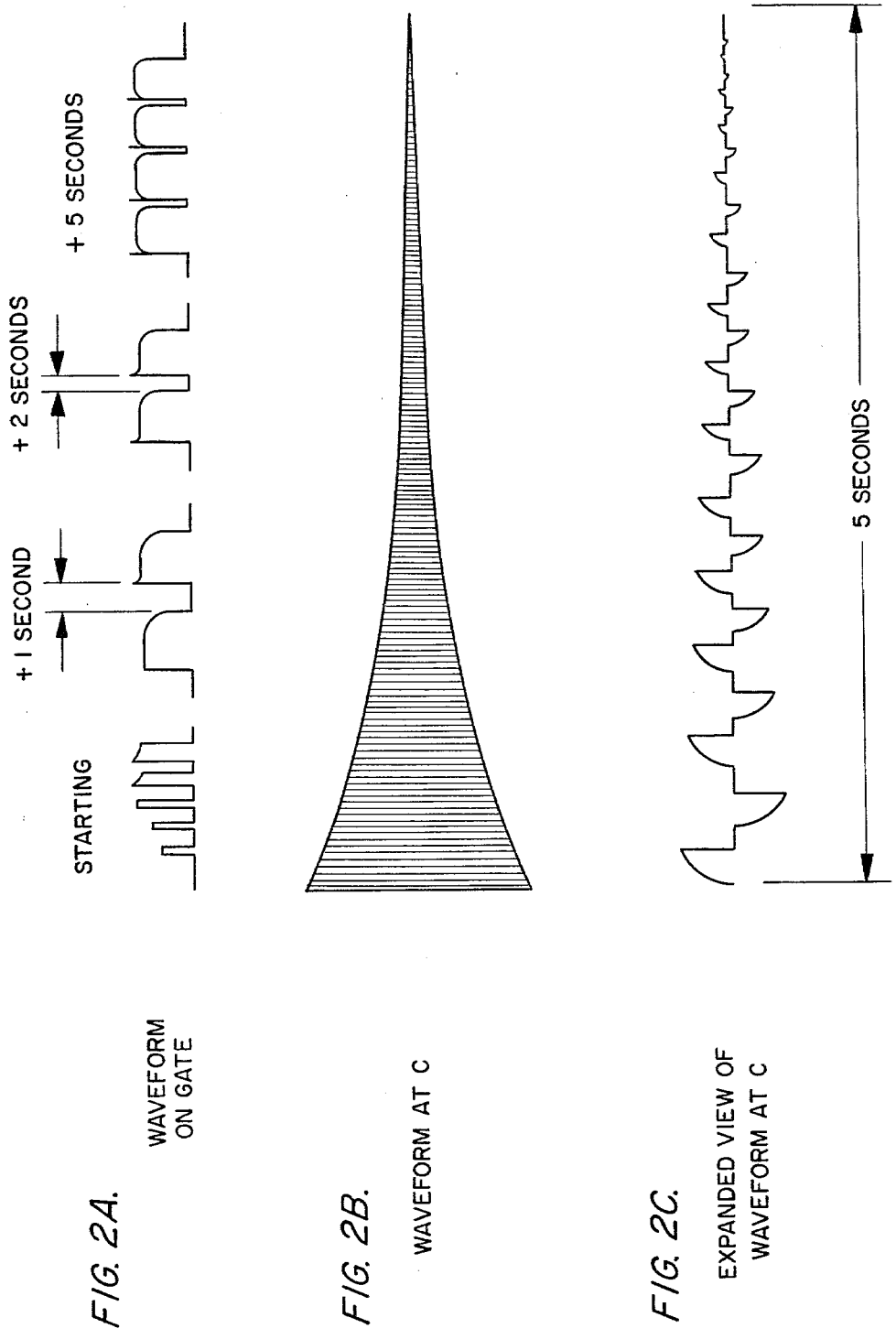

FIRING ANGLE OF TRIAC

VOLTAGE AT C AND APPLIED TO LOAD

SOLID STATE CONTROL DEVICE FOR GRADUALLY TURNING ON AND OFF AN ELECTRICAL LOAD

BACKGROUND OF THE INVENTION

The present invention is directed to a solid state control device for controlling the turn on and turn off of electrical loads such as incandescent lights. In particular, the invention provides for gradual turn on and turn off of a light bulb to increase the bulb life.

The present invention relates to solid state control of light bulbs and the elimination of problems associated with normal mechanical contact on/off switching devices. It is known in the prior art to use solid state switching devices such as silicon controlled rectifiers (SCR) or triacs for light control and dimming. Since these solid state switching devices readily lend themselves to control over most of the AC sine wave, these devices are ideal for this type of application. However, little thought has been given to the concepts of possible energy savings via the wall switch or to increasing the life of the light bulbs.

Naturally, an energy savings can be effected by dimming an electrical load such as a light bulb. Likewise, bulb life can be extended by operating the light bulb at a reduced voltage either by use of a dimmer device or by use of any one of a number of devices which block a portion of the AC wave form, such as a diode in series with the light bulb. However, the use of such devices for energy savings or to extend bulb life is suspect. For example, typical energy savings devices reduce light output enough so that a higher wattage bulb must be used thereby negating the energy savings.

In nearly 70% of all light bulb applications, it would be possible to control the period of time the light bulb is used by automatically switching it off after a predetermined period of time. Control in this fashion would be particularly useful if it were possible to override the timed turn off feature. Typical applications for a switch of this type would include lights for closets, halls, garages, stairwells, porch and bathroom. Nearly any light bulb could be controlled in this manner if the timed turn off period is adjustable.

An additional feature of a solid state control device of this type would be to extend bulb life by means of controlled turn on as well as controlled turn off. The electrical resistance of the bulb filament is quite low when the filament is cold, normally on the order of 10 to 30 ohms (dependent upon bulb wattage). As the filament heats, this resistance increases to an order of 150 to 200 ohms which is a factor greater than ten to one. This low initial resistance causes a tremendous surge of current at turn on which coincidentally is when most bulbs burn out. The repeated heating and cooling of the filament, coupled with current surges put through it, causes bending and weakening of the filament which eventually results in failure of the light bulb.

Several circuits are known in the prior art to effect the gradual turn on and turn off of electrical loads such as incandescent light bulbs. For example, the United States Pat. No. 4,008,416 issued on Feb. 15, 1977 to Henry H. Hakasone, several circuits are shown for providing gradual turn on and turn off of an incandescent light bulb. Some of these circuits employ a thermistor which changes the conduction angle of a solid state device to gradually apply power to the bulb to extend bulb life. This patent also shows two circuits in FIGS. 5 and 6 which use capacitors to effect a gradual turn on and turn off of the bulb. In particular, in FIG. 5, a capacitor C5 gradually charges to increase the conduction angle of diacs 109 and 110 to eventually trigger the triac 111 which results in a gradual increase in the intensity of the light bulb L1. Gradual turn off of the light bulb L1 is accomplished by gradually decreasing the charge on the capacitor C5 by discharging the capacitor through resistors 112 and 113. Similarly, with respect to FIG. 6, capacitors C8 and C9 are charged and discharged to gradually turn on and turn off the light bulb L3. Although these latter circuits accomplish both gradual turn on and turn off of the light bulb, a large number of components is required including multiple triacs, resistors, capacitors, etc.

In a subsequent U.S. Pat. No. 4,152,608 issued to Nakasone, et al, on May 1, 1979, several improvements were made in the above described circuits. This later Nakasone, et al, patent describes a circuit which gradually changes the amount of AC power applied to a light bulb following a change in the state a bi-stable switch. The circuit includes a charging capacitor which is charged and discharged upon actuation of the bi-stable switch to turn a triac on and off to actuate the light bulb. A transistor circuit is connected to the capacitor to charge and discharge the capacitor in accordance with the position of the bi-stable switch.

In addition to the above circuits, several other patents disclose circuits for controlling the energization of an electrical load. In U.S. Pat. No. 4,082,961 issued on Apr. 4, 1978 to Luther L. Genuit, several turn off circuits use an SCR or triac which is responsive to a decrease in the charge on a capacitor to gradually change its conduction angle. As the SCR or triac fires at later points in the half cycle of the applied AC signal, the light bulb is gradually turned off. The purpose of this circuit is to energize the light bulb for a period of time after turning off the light switch. In U.S. Pat. No. 3,991,343 issued on Nov. 9, 1976, to Henry Delpy, a light control circuit is shown for progressively varying the illumination of a lamp by charging or discharging several capacitors connected to an SCR. However, the on/off cycle of the light control circuit is automatic and is not directly responsive to the position of the switch.

While the above patents show electronic switching arrangements for controlling the turn on and turn off of electrical loads, other types of circuits are known in the art. For example, traditional light dimmer switches employ potentiometers to control the power applied to an electrical load such as a light bulb. Many different modifications of these traditional dimmer type control circuits are known in the art using various combinations of RC circuits, transistors and SCRs.

As evident from the above discussion, all the known prior art circuits use a large number of electrical components to achieve relatively simple control features. Since a premium is placed on the number of components in any such circuit because of the ultimate consumer costs, it is highly desirable to minimize the number of components while maintaining a high degree of reliability. Although the prior art recognizes the need for simplicity, the known circuits use an excessive number of components.

SUMMARY OF THE INVENTION

It is a primary object of the present invention to provide a solid state control device for gradually turning electrical loads such as incandescent light bulbs on and off to materially improve the life of the control device over mechanical contact switches while also being inherently safer than mechanical contact switches in the event of any component failure.

It is a further object of the present invention to provide a control device for timed turn off of a light bulb so that the light bulb will be automatically extinguished after a predetermined period of time. In this regard, the control device provides for the adjustment of the period of time during which the bulb remains on as well as an override feature.

It is an additional object of the present invention to provide a solid state control device with automatic control of the turn on of a light bulb to eliminate the current surge in the filament when the bulb is cold and its electrical resistance is low. Accordingly, it is an object of the present invention to extend the life of a light bulb by providing a gradual change in the amount of AC power applied to the light bulb following actuation of a mechanical switch.

Another object of the present invention is to provide a solid state control device which can be used to physically replace existing mechanical contact switches such as any conventional household light switch without changing the household wiring.

Other objects and advantages of the present invention will be obvious from the detailed description of the preferred embodiment.

The solid state control device of the present invention controls the turn on and turn off of electrical loads such as incandescent light bulbs. The electrical load is connected to an AC power source and in series with a full wave rectifier which has a semiconductor switching circuit connected across the terminals of the full wave rectifier. The semiconductor switching circuit includes an SCR or triac which provides a short circuit across the full wave rectifier when the SCR or triac is fired or turned on. In other words, before current can pass through the full wave rectifier in either direction, the SCR or triac must be turned on to provide a short circuit across the full wave rectifier. A mechanical switch having on, off and timed off positions actuates the semiconductor switching circuit. A capacitor which is connected to the gate of the triac or SCR is normally charged when the mechanical switch is in the off position. Upon turning the switch to the on position, the capacitor is discharged to slowly turn on the SCR or triac to actuate the light bulb. The firing angle of the triac or SCR gradually decreases until the triac or SCR is continuously turned on which also continuously actuates the load or light bulb. The period of time for turning on the light bulb is approximately three to four seconds. Then, when the mechanical switch is turned to the timed off position, the capacitor is gradually charged through the gate leakage path of the triac or SCR to again turn off the triac or SCR. The conduction angle of the triac or SCR is gradually changed by the increasing charge on the capacitor until it shuts off completely. Accordingly, the light bulb is gradually turned off over a period of 5-20 minutes as the triac or SCR is fired at greater and greater conduction angles. Thus, a single charging capacitor in combination with a triac or SCR effects both gradual turn on and turn off of the light bulb.

The basic principle of the solid state control device is that it makes use of an often overlooked and usually undesirable characteristic of triacs and SCRs of gate leakage current. The gate leakage current is used to charge the charging capacitor which then controls the firing of the triac or SCR. When the circuit is turned on, the charging capacitor is discharged and appears as a dead short which causes the triac or SCR to turn on to thereby turn on the light bulb. As the capacitor charges, it approaches the potential across the full wave rectifier so that the gate eventually reaches the same potential as the cathode to turn the triac or SCR off at the next zero crossing of the AC wave form. Thus, by using the gate leakage current of a triac or SCR, a simple, inexpensive solid state control device with a minimum number of components can be built to accomplish both gradual turn on and turn off of an electrical load such as an incandescent light bulb.

BRIEF DESCRIPTION OF THE DRAWINGS

FIGS. 2A-2E are wave forms illustrating the operation of the solid state control device of FIG. 1.

DESCRIPTION OF THE PREFERRED EMBODIMENT

Figure 1:
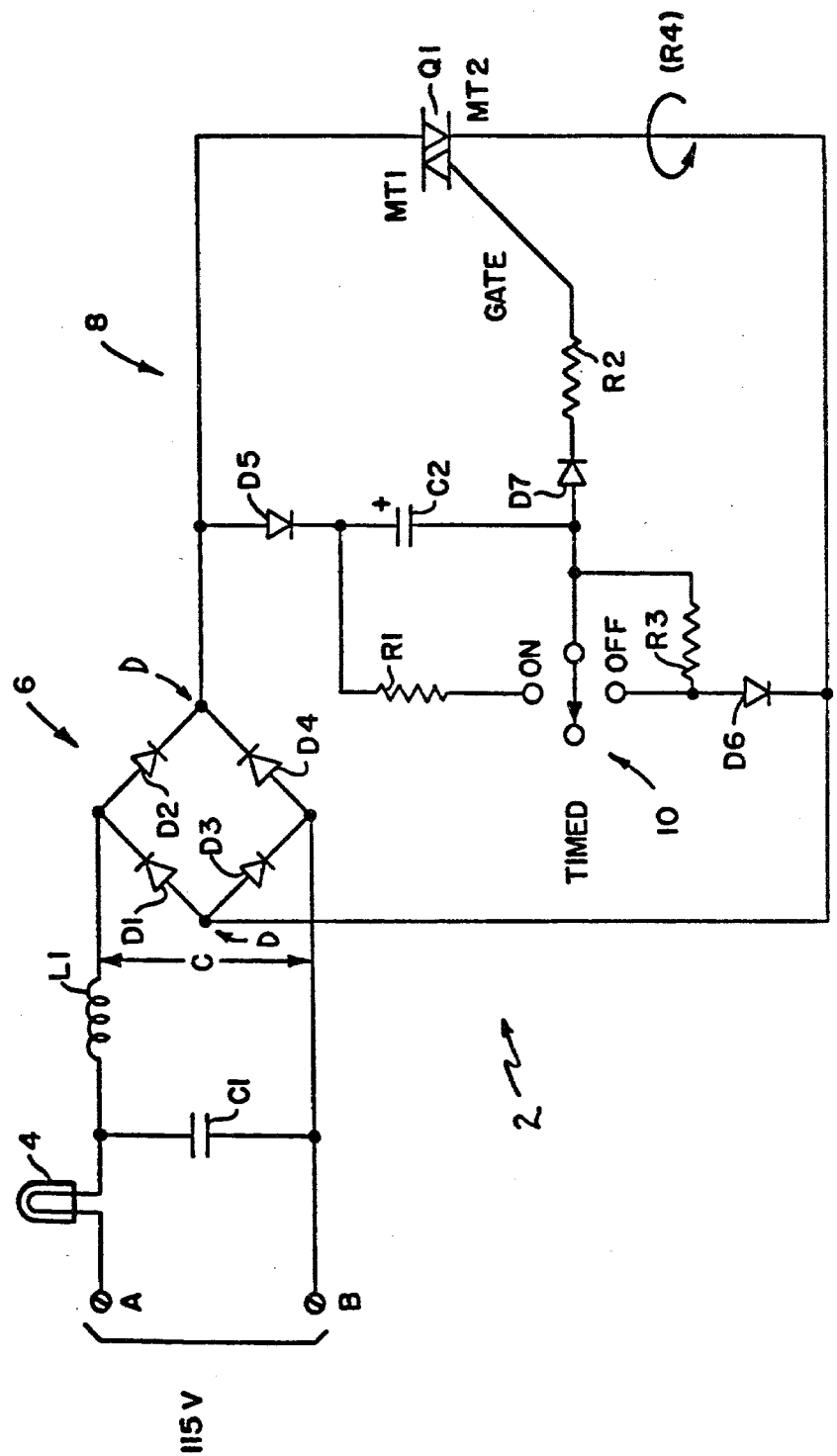
FIG. 1 is a schematic diagram of the solid state control device of the present invention.

Referring first to the schematic diagram in FIG. 1 of the drawings, the preferred embodiment of the solid state control device 2 of the present invention is shown. This solid state control device 2 is connected to a 115 volt AC power source across terminals A and B. An incandescent light bulb or electrical load 4 is connected between the AC power source and a full wave rectifier 6. An inductor L1 and capacitor C1 are connected between the full wave rectifier 6 and the incandescent light 4 in a conventional manner. The full wave rectifier 6 includes a plurality of diodes D1-D4 connected as a full wave bridge rectifier. Thus, in order for the light bulb 4 to turn on, the full wave rectifier 6 must conduct current across terminals C so that current can flow from terminal A through the light bulb 4 across the full wave rectifier 6 back to terminal B.

Current cannot flow across terminals C of the full wave rectifier 6 unless a short circuit is provided across terminals D of the full wave rectifier 6 by the semiconductor switching circuit 8. In other words, the positive portion of the AC sine wave flows in a path through the light bulb 4, the diode D2, the semiconductor switching circuit 8, the diode D3 back to the AC power source. Similarly, the negative portion of the AC sine wave flows in a path through diode D1, the semiconductor switching circuit 8 and the diode D4 back to the AC power source. As a result, current flow through the light bulb 4 is controlled by the semiconductor switching circuit 8.

The semiconductor switching circuit 8 includes a triac Q1 having its MT1 and MT2 terminals connected directly across the terminals D of the full wave rectifier 6. When the triac Q1 is turned on, it effectively causes a short circuit across the terminals D of the full wave rectifier 6 to turn on the light bulb 4. The gate of the triac Q1 is connected to a resistive capacitive network which includes charging capacitor C2. The charging capacitor C2 is connected across the terminal MT1 and the gate of the triac Q1 through diodes D5 and D7 and resistor R2. The charging capacitor C2 is charged through a current path from the full wave rectifier 6 through diode D5, capacitor C2, diode D7, resistor R2, the gate leakage path of the triac Q1, the terminal MT2 and back to the full wave rectifier 6. A discharging path is also provided for the capacitor C2 through the resistor R1 which is connected across capacitor C2 and the mechanical switch 10. An additional diode D6 and resistor R3 provide circuit stability and interact with the mechanical switch 10 as described in further detail below.

The mechanical switch 10 has three positions including on, off and timed off positions. When the mechanical switch 10 is in the off position, current flows from the full wave rectifier 6 to the capacitor C2 to charge the capacitor C2 as described above. The charging path includes the gate leakage path of the triac Q1 which is represented by resistor R4 in FIG. 1. Some charging current also flows from the full wave rectifier 6 through diode D5 to capacitor C2 through diode D6 back to the full wave rectifier 6 when the mechanical switch 10 is in the off position. However, the resistor R3 has a very high resistance which minimizes the amount of current in this current path. When the capacitor C2 is charged, it presents a very high impedance to the gate of the triac Q1 which turns off the triac Q1.

In the event the mechanical switch 10 is turned to the on position, the capacitor C2 is discharged through the resistor R1 and the mechanical switch 10. The main function of the resistor R1 is to discharge capacitor C2; the RC time constant of capacitor C2 and resistor R1 determines the time it takes for a gradual turn on of the triac Q1. As generally known in the art, a triac requires a different amount of current to fire it in different quadrants. As shown by the wave form in FIG. 2D, the triac Q1 initially fires at 90° and 270° but does not fire in the quadrants at 0° and 180°. Thus, the triac Q1 is 50% turned on when the mechanical switch 10 is switched to the on position; the remaining 50% is controlled by the discharge of capacitor C2. As the capacitor C2 discharges, it presents a lower and lower impedance to the gate of the triac Q1 which gradually increases the conduction angle of the triac Q1. The RC time period for capacitor C1 and resistor R1 determines the time it takes triac Q1 to fully turn on and this time period is generally of the order of 3–4 seconds. The conduction or firing angle of the triac Q1 in the first and third quadrants is gradually increased by the discharging of capacitor C2 until the triac Q1 is fully conductive which results in the light bulb 4 being fully actuated.

When the mechanical switch 10 is switched from the on position to the off position, the capacitor C2 is almost immediately charged through the current path formed by the diode D5, the capacitor C2, the mechanical switch 10 and the diode D6. The charging of the capacitor C2 through this current path causes the gate of triac Q1 to approach the same potential as MT2 and thus to render the triac Q1 nonconductive. Therefore, the light bulb 4 is immediately turned off.

On the other hand, when the mechanical switch 10 is turned from the on to the timed off position, the capacitor C2 is not immediately charged but rather is charged over a period of time which is primarily determined by the time constant of capacitor C2 and resistor R2. Current flows through diode D5, capacitor C2, diode D7, resistor R2, the gate leakage path of triac Q1 and back to the full wave rectifier 6 to charge capacitor C2. The values of resistor R2 and capacitor C2 can be adjusted to vary the time interval although in the preferred embodiment the time interval is in the range of 5 to 20 minutes. By making resistor R2 variable, the time interval may be adjusted within this general range. As the capacitor C2 slowly charges, the triac Q1 fires later and later until it fires only 50% of the time. At this point, the triac Q1 shuts off completely at the next zero crossing of the AC wave form.

The primary function of the resistor R3 and the diode D6 is to provide stability when the triac Q1 is completely turned off and the mechanical switch 10 is in the timed off position. When the triac Q1 is turned off, the gate no longer acts as a source of current for the capacitor C2 so that the capacitor C2 could conceivably slowly discharge before the mechanical switch is switched to the on position. The resistor R3 together with the diode D6 compensates for the internal leakage of the capacitor C2 to prevent the light bulb 4 from flickering. Finally, during severe fluctuations in line voltage, resistor R3 and diode D6 maintain the charge on capacitor C2.

Figure 2D:
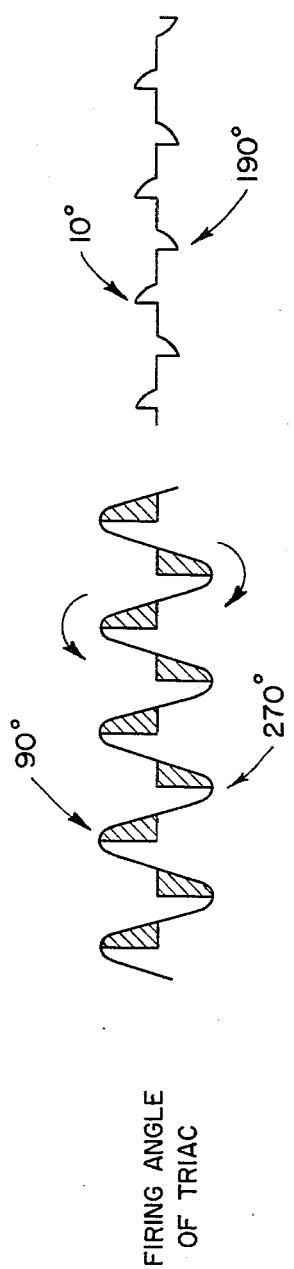

Turning now to the wave forms in FIGS. 2A–2E, these wave forms illustrate the operation of the solid state switching device of FIG. 1 when the mechanical switch 10 is switched to the on position. The wave form in FIG. 2A illustrates the voltage on the gate of the triac over a 5 second time interval after the mechanical switch 10 is switched to the on position. Initially, the charged capacitor C2 acts as a high impedance across the gate of the triac Q1. As a result, short starting pulses occur on the gate of the triac Q1 which turn the triac Q1 on for a short duration. As the capacitor C2 continues to discharge, the impedance of the capacitor is reduced and the pulses applied to the gate of the triac Q1 increase in width until the triac is essentially turned on continuously after a time interval of approximately 3–4 seconds.

The changes in the firing angle or conduction of the triac Q1 are illustrated by the wave form in FIG. 2D. This wave form essentially represents the wave form across the terminals MT1 and MT2 of the triac Q1. Initially, the triac fires at an angle of 90° and 270° due to well known characteristics of triacs. Gradually, as the capacitor C2 discharges and the pulses on the gate of the triac Q1 widen as illustrated by FIG. 2A, the triac fires earlier and earlier so that the firing angle works its way back to approximately 10° and 190° as illustrated on the right hand portion of FIG. 2D. From a practical standpoint, there will always be a brief period of time in each half-cycle of the applied AC wave form in which the triac Q1 is not fired as illustrated.

Upon the firing of the triac Q1, the voltage across terminals C of the full wave rectifier 6 will change to essentially zero because the triac Q1 forms a short circuit across terminals D. When the triac starts firing, the wave form across terminals C looks like the wave forms in FIGS. 2B and 2C. FIG. 2B shows the envelope of the wave form across terminals C and illustrates that the voltage across terminals C gradually diminishes as the triac Q1 is fired at earlier and earlier conduction angles. When the triac is essentially fired at a continuous rate, the voltage across terminals C is essentially zero, because a dead short occurs across terminals D. An expanded view of the wave form across terminals C is illustrated in FIG. 2C which shows the peak to peak voltage change. As illustrated, when the triac Q1 fires, the voltage across terminals C is zero and when the triac Q1 is not firing, a voltage occurs across terminals C corresponding to a portion of the applied AC wave form. However, as the triac Q1 fires at smaller conduction angles, the peak to peak voltage of the wave form across terminals C decreases until it reaches essentially zero.

Figure 2E:
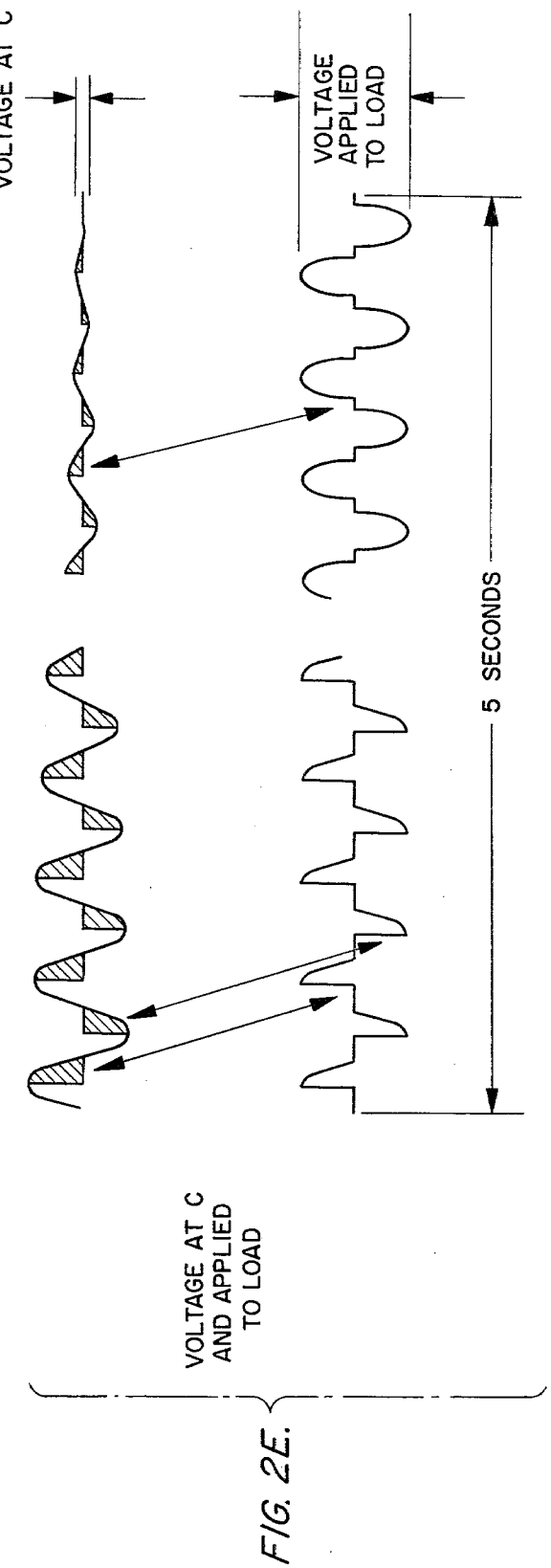

A comparison to the voltage wave forms at terminals C with the voltage applied to the light bulb 4 is shown in FIG. 2E. Initially, when the voltage at terminals C is about 60 volts due to the firing of the triac Q1 at firing angles 90° and 270°, 50% of the applied AC sine wave form appears across the light bulb 4. The shaded portions of the top wave form in FIG. 2E illustrates the portions of the wave form across terminals C which are not received by the light bulb 4. As the voltage at terminals C decreases toward zero, the voltage applied to the light bulb 4 approaches the applied AC sine wave form except for a brief portion of the wave form during which the triac Q1 must draw enough current to remain latched in the on condition.

Although the operation of the circuit arrangement of FIG. 1 has been described with respect to the on position of the mechanical switch 10, an analogous operation occurs when the mechanical switch 10 is switched to the timed off position. In this latter event, the capacitor C2 gradually charges to shorten the pulses applied to the gate of the triac Q1. The triac Q1 fires less and less frequently until it is firing only 50% of the time at which point it shuts off completely at the next zero crossing of the applied AC sine wave form. When the triac Q1 shuts off completely, the light bulb 4 no longer receives any current and it is turned off.

Figure 3:
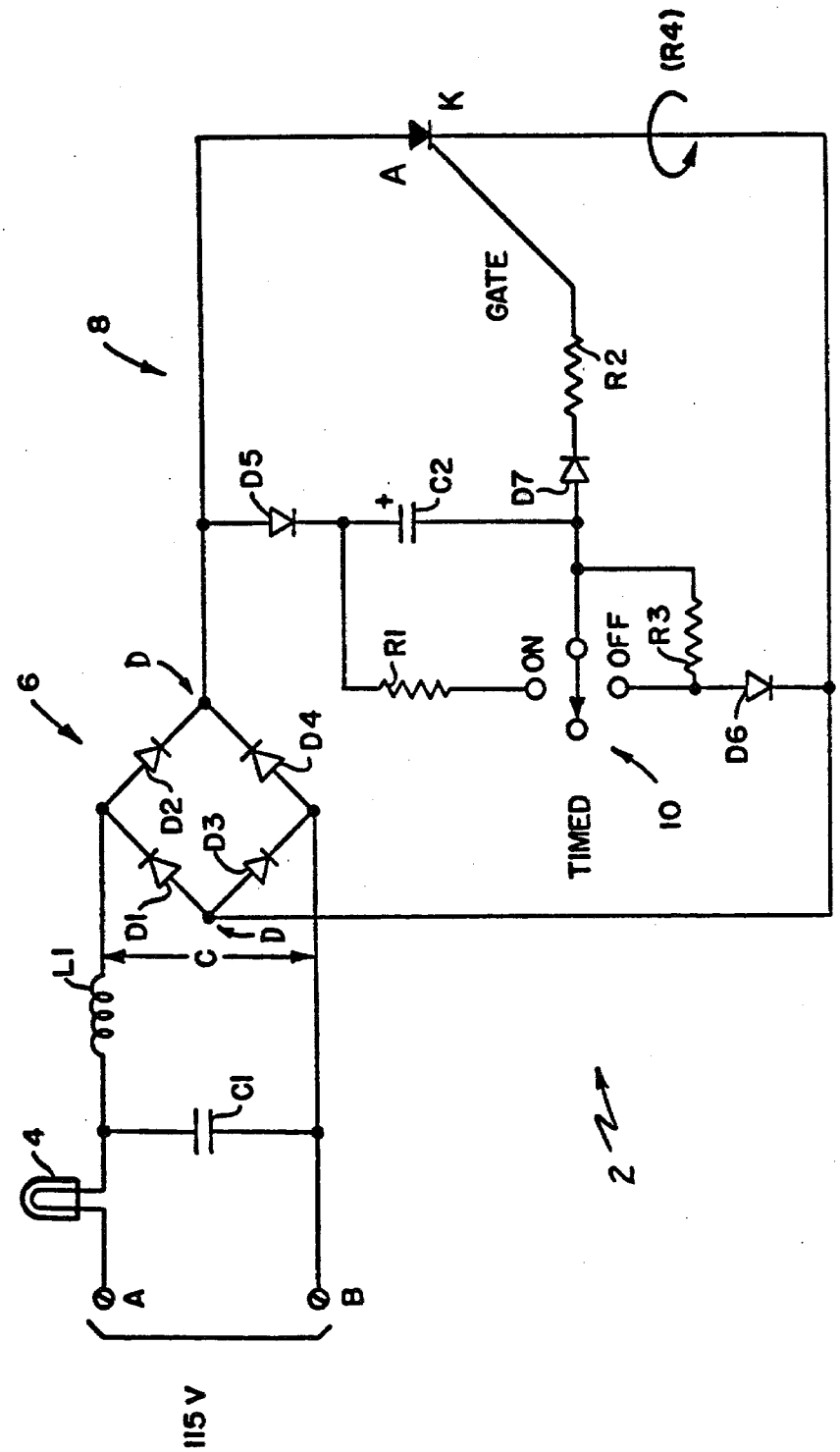
FIG. 3 is a schematic diagram of another embodiment of the solid state control device of the present invention.

The same basic operation occurs when an SCR is substituted for the triac as shown in FIG. 3. The pulses applied to the gate of the SCR are the same as illustrated in FIG. 2A; these pulses cause the SCR to fire gradually in all quadrants until it is essentially firing continuously. From a practical standpoint, the operation of the circuit with an SCR is the same as the operation with a triac.

By gradually applying voltage to an electrical load such as a light bulb, the solid state control device of the present invention improves bulb life by gradually heating the filament to prevent burn out. Additionally, the same components are used to gradually turn on and turn off the light bulb through a very simple circuit which utilizes the gate leakage current of a triac or SCR.

Although illustrative embodiments of the invention have been described in detail with reference to the accompanying drawings, it is to be understood that the invention is not limited to those precise embodiments and that various changes and modifications may be effected therein by one skilled in the art without departing from the scope or spirit of the invention. For example, the substitution of an SCR for the triac described in the preferred embodiment would be apparent to those skilled in the art.

I claim:
1. A solid state control device for gradually actuating and deactuating an electrical load such as a light bulb, said solid state control device being connected to AC power supply means for supplying AC power to said electrical load, said solid state control device comprising:
  a gate controlled solid state switch having a gate and two main terminals coupled in series with said electrical load, said gate controlled solid state switch turning said electrical load on and off in accordance with the on and off condition of said gate controlled solid state switch;
  a charging capacitor coupled between said gate and one of said two main terminals of said gate controlled solid state switch, said charging capacitor causing said gate controlled solid state switch to turn off when charged and to turn on when discharged;
  a mechanical switch coupled to said charging capacitor and having at least two positions, an on position for turning said electrical load on and a timed off position for turning said electrical load off;
  charging means connected to said charging capacitor for gradually charging said charging capacitor when said mechanical switch is in said timed off position, said charging means being responsive to the leakage current in said gate of said gate controlled solid state switch to gradually charge said charging capacitor to turn off said gate controlled solid state switch at increasing conduction angles as the charge on said charging capacitor increases to gradually deactuate said electrical load;
  discharging means connected to said charging capacitor for gradually discharging said charging capacitor when said mechanical switch is in said on position to turn on said gate controlled solid state switch at decreasing conduction angles as the charge on said charging capacitor decreases to gradually actuate said electrical load; and
  a full wave rectifier connected to said electrical load, said two main terminals of said gate controlled solid state switch being connected across said full wave rectifier to short circuit said full wave rectifier when said gate controlled solid state switch is turned on.

2. The solid state control device of claim 1 wherein said gate controlled solid state switch is a triac.

3. The solid state control device of claim 2 wherein the firing angle of said triac varies in response to the charge on said charging capacitor.

4. The solid state control device of claim 1 wherein said gate controlled solid state switch is an SCR.

5. The solid state control device of claim 1 wherein said discharging means comprises a resistor connected in parallel to said charging capacitor when said mechanical switch is in said on position, said resistor and said charging capacitor determining the time period for continuously turning on said gate controlled solid state switch.

6. The solid state control device of claim 1 wherein said charging means comprises a resistor connected in series with said charging capacitor and said gate, said resistor and said charging capacitor determining the time period for continuously turning off said gate controlled solid state switch.

7. The solid state control device of claims 1 or 6 wherein said charging means further comprises a diode in series with said charging capacitor to pass current in one direction to said charging capacitor and said gate of said gate controlled solid state switch.

8. The solid state control device of claim 1 wherein said mechanical switch has an off position which enables said charging capacitor to charge immediately to turn off said gate controlled solid state switch and deactuate said electrical load.

9. The solid state control device of claim 1 further comprising resistance means connected to said charging capacitor for providing a high impedance to maintain said charging capacitor charged when said mechanical switch is in said timed off position.

10. The solid state control device of claim 1 wherein said full wave rectifier is a full wave bridge rectifier.

* * * * *